(12) United States Patent
Kurimoto (10) Patent No.: US 8,896,392 B2
(45) Date of Patent: Nov. 25, 2014

(54) TRANSMISSION SYSTEM

(75) Inventor: Mitsuhiro Kurimoto, Tokyo (JP)

(73) Assignee: Hochiki Corporation, Tokyo (JP)

( * ) Notice: Subject to any disclaimer, the term of this patent is extended or adjusted under 35 U.S.C. 154(b) by 895 days.

(21) Appl. No.: 13/003,819

(22) PCT Filed: Jul. 9, 2009

(86) PCT No.: PCT/JP2009/062555
§ 371 (c)(1),
(2), (4) Date: Jan. 12, 2011

(87) PCT Pub. No.: WO2010/007941
PCT Pub. Date: Jan. 21, 2010

(65) Prior Publication Data
US 2011/0121921 A1 May 26, 2011

(30) Foreign Application Priority Data
Jul. 14, 2008 (JP) ................................ 2008-182347

(51) Int. Cl.
H03H 7/38 (2006.01)
H04B 3/02 (2006.01)
H01P 5/12 (2006.01)

(52) U.S. Cl.
CPC ................. *H04B 3/02* (2013.01); *H03H 7/383* (2013.01); *H01P 5/12* (2013.01)
USPC ............................ 333/33; 333/22 R; 333/125

(58) Field of Classification Search
CPC ............. H03H 7/383; H01P 5/12; H04B 3/02
USPC .......................... 333/33, 124, 172, 125, 22 R
See application file for complete search history.

(56) References Cited

U.S. PATENT DOCUMENTS

| | | | | |
|---|---|---|---|---|
| 4,107,554 A | * | 8/1978 | Yao | 327/367 |
| 5,686,872 A | * | 11/1997 | Fried et al. | 333/22 R |
| 5,825,259 A | * | 10/1998 | Harpham | 333/22 R |

FOREIGN PATENT DOCUMENTS

| | | |
|---|---|---|
| JP | 55-66459 U | 5/1980 |
| JP | 56-019255 | 2/1981 |
| JP | 63-281501 | 11/1988 |
| JP | 7225889 A | 8/1995 |
| JP | 09-091576 | 4/1997 |
| JP | 11-177189 | 7/1999 |
| JP | 11-313312 | 11/1999 |
| JP | 2000-341422 A | 12/2000 |
| JP | 2004-304365 | 10/2004 |
| JP | 2005-160925 | 6/2005 |
| JP | 2005-311873 | 11/2005 |
| WO | 2007/108303 | 9/2007 |

OTHER PUBLICATIONS

Japanese Patent Office, Office Action issued for Japanese application 2010-520843, mailed on Jul. 2, 2013, 8pp. incl. English translation.
European Search Report issued in Application No. 09797866.2-1246, dated Aug. 4, 2011, 5 pages.
Japanese Patent Office; Search Report and Written Opinion in International Patent Application No. PCT/JP2009/062555 dated Oct. 20, 2009.
Japanese Patent Office, Notice of Reasons for Rejection issued in corresponding Japanese Patent Application No. 2010-520843 and English-language translation (Mar. 11, 2014) (8 pages).

* cited by examiner

*Primary Examiner* — Benny Lee
*Assistant Examiner* — Rakesh Patel
(74) *Attorney, Agent, or Firm* — Wood, Herron & Evans, LLP (57) ABSTRACT

A transmission system transmits a signal from a transmission terminal to a reception terminal via a pair of transmission lines. The transmission terminal side of the transmission lines is connected to a first resistor having a predetermined resistance value depending on the characteristic impedance of the transmission lines.

7 Claims, 10 Drawing Sheets

TRANSMISSION SYSTEM

TECHNICAL FIELD

The present invention relates to a transmission system used for signal transmission for disaster prevention monitoring such as fire monitoring.

Priority is claimed on Japanese Patent Application No. 2008-182347 filed Jul. 14, 2008, the contents of which are incorporated herein by reference.

BACKGROUND ART

Conventionally, a disaster prevention monitoring system that monitors for abnormalities such as fire or gas leakage by connecting a sensor such as a fire detector or gas detector to a transmission line of a receiver has been put to practical use. In this disaster prevention monitoring system, a digital signal serving as a downward telegraphic message of for example, control information is transmitted from the receiver to a terminal (sensor) in a voltage mode. On the other hand, a digital signal serving as an upward telegraphic message of, for example, sensor information is transmitted from the terminal to the receiver in the current mode.

Figure 11:
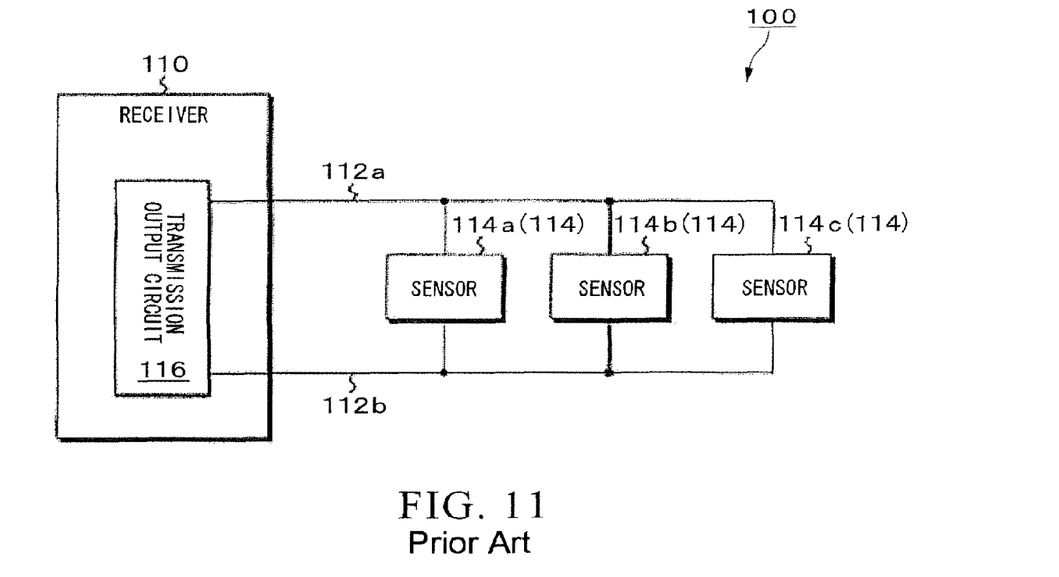
FIG. 11 is a block diagram showing a conventional transmission system in which impedance matching is not performed.

FIG. 11 shows a transmission system 100 used for conventional disaster prevention monitoring (for example, refer to Patent Document 1).

A pair of transmission lines 112a and 112b also functioning as power supply lines are led out from a transmission output circuit 116 provided in a receiver 110 toward a monitoring terminal side. For example, sensors 114 (114a, 114b, 114c) having a digital transmission function are used as a plurality of monitoring terminals, and these sensors 114 are connected to the pair of transmission lines 112a and 112b.

Figure 12:
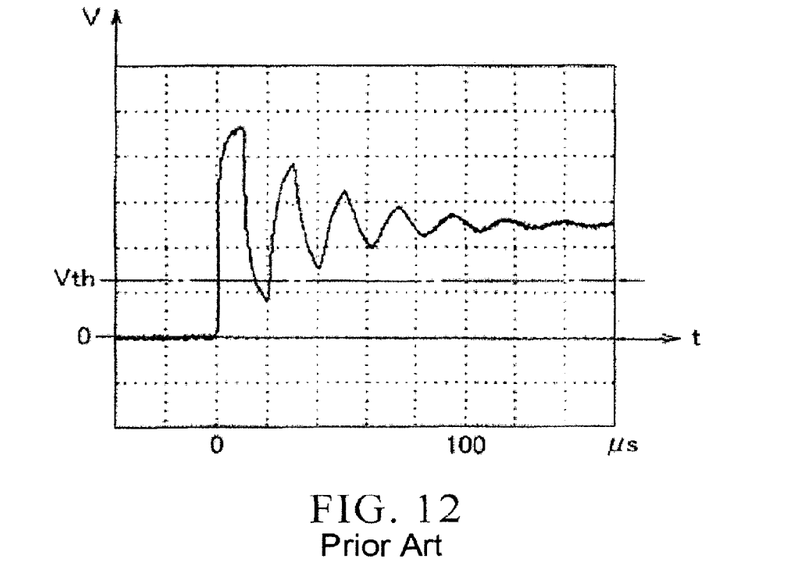
FIG. 12 is an explanatory diagram showing a waveform of a voltage pulse at the terminal end side of the transmission lines when impedance is not matched, in the transmission system shown in FIG. 11.

Incidentally, in the transmission system shown in FIG. 11, if a digital signal comprising a rectangular pulse train is transmitted from the transmission output circuit 116 to the sensors 114 without performing impedance matching, the signal is reflected and travels back and forth between the transmission ends and the last ends of the pair of transmission lines 112a and 112b, that is, between the transmission output circuit 116 and the sensor 114c. As a result, as shown in the waveform in FIG. 12, ringing occurs in the digital signal at the terminal end side of the pair of transmission lines 112a and 112b. Therefore, transmission and reception of the digital signal cannot be performed normally between the receiver 110 and the sensors 114.

Figure 13:
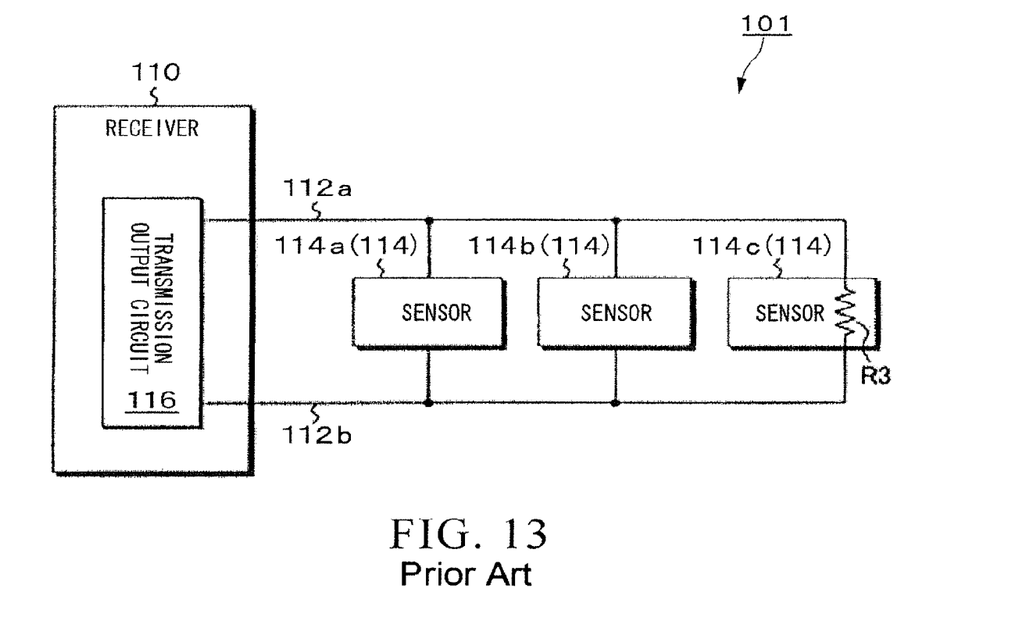
FIG. 13 is a block diagram showing a conventional transmission system in which a resistor is inserted into a sensor at terminal ends of the transmission lines to perform impedance matching.
Figure 14:
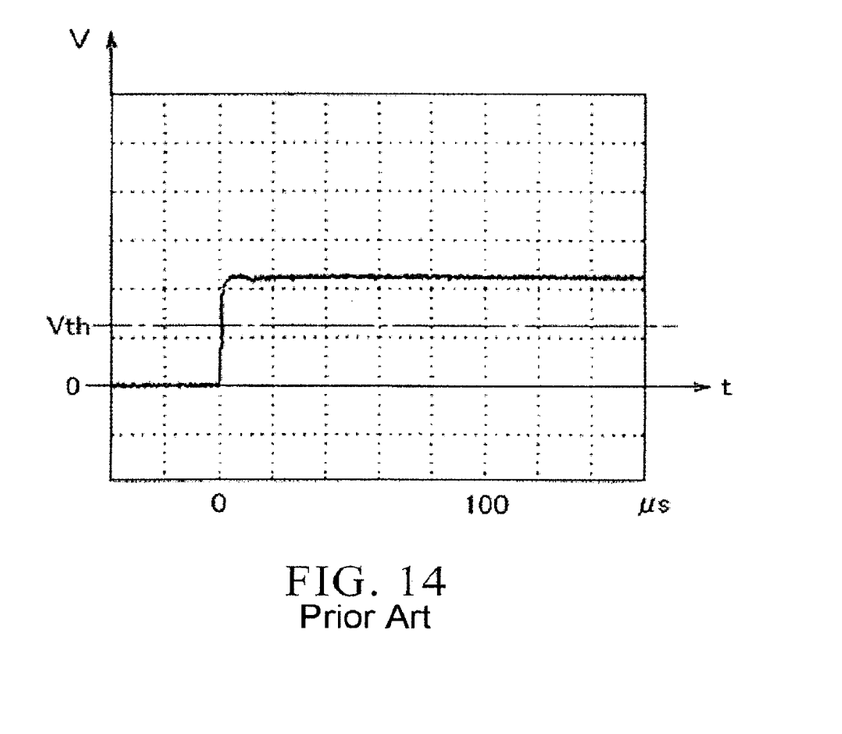
FIG. 14 is a diagram showing a waveform of a voltage pulse at the terminal end side of the transmission lines, when impedance matching is performed in the transmission system shown in FIG. 13.

Conventionally as a countermeasure against this problem, as shown in FIG. 13, a resistor R3 having a resistance value equal to a characteristic impedance Z of the pair of transmission lines 112a and 112b is inserted into the sensor 114c connected to the terminal ends of the pair of transmission lines 112a and 112b, to perform impedance matching. As a result, as shown in FIG. 14, waveform ringing in the digital signal can be suppressed on the terminal end side of the pair of transmission lines 112a and 112b.

[Patent Document 1] Japanese Unexamined Patent Application, First Publication No. H09-91576

DISCLOSURE OF INVENTION

Problems to be Solved by the Invention

However, in the conventional transmission system for disaster prevention monitoring, to achieve impedance matching, an operation for checking the sensor 114c connected to the terminal ends of the pair of transmission lines 112a and 112b to insert the resistor R3 into the sensor 114c is complicated. Moreover, if the resistor R3 is inserted by error into the sensor 114a or 114b other than the sensor 114c connected to the terminal ends of the pair of transmission lines 112a and 112b, transmission of the digital signal cannot be performed normally between these sensors 114a and 114b and the transmitter-receiver 110.

Furthermore, in the disaster prevention monitoring system aimed at fire monitoring and security, the transmission lines from the receiver are branched along the way and led out toward each terminal side. In the case of the transmission system in which the transmission lines are branched in this way, the terminal ends of the transmission lines are at a plurality of locations. Therefore, it may be difficult to apply such a method where a resistor is inserted into a sensor at terminal ends to achieve impedance matching.

The invention was made with respect to the above-described problems, it is an object of the present invention to provide a transmission system that can suppress ringing in a digital signal by achieving impedance matching without inserting a resistor into a sensor on the terminal end side of transmission lines.

Means for Solving the Problem

The present invention adopts the following measures in order to solve the above-described problems and achieve the object of the present invention.

(1) A transmission system of the present invention is for transmitting a signal from a transmission end to a reception end via a pair of transmission lines, wherein a first resistor having a predetermined resistance value depending on a characteristic impedance of the transmission lines is connected to the transmission end side of the transmission lines.

(2) In the transmission system described in the above (1), the first resistor may be connected to the transmission end side of one transmission line of the pair of transmission lines.

(3) In the transmission system described in the above (2), the first resistor may have a resistance value equal to the characteristic impedance of the transmission lines.

(4) In the transmission system described in the above (2), the first resistor may have a resistance value of from 0.2 times to 0.8 times or from 1.5 times to 5.0 times of the characteristic impedance of the transmission lines.

(5) In the transmission system described in the above (1), a second resistor may be respectively connected to a transmission end side of both transmission lines of the pair of transmission lines, and the resistance values of the second resistors may be respectively half the resistance value of the first resistor.

(6) In the transmission system described in the above (5), the second resistor may respectively have a resistance value of half the characteristic impedance of the transmission lines.

(7) In the transmission system described in the above (5), the second resistor may respectively have a resistance value of half the resistance value of from 0.2 times to 0.8 times or from 1.5 times to 5.0 times of the characteristic impedance of the transmission lines.

(8) In the transmission system described in the above (1), an inductance that bypasses direct-current power may be further connected in parallel with the resistance by the transmission lines.

Effects of the Invention

According to the transmission system described in the above (1), the first resistor for achieving impedance matching needs only to be connected to the transmission line at the transmission end side such as a receiver. Therefore, it is not necessary to check the sensor connected to the terminal ends of the transmission lines to insert a resistor in the sensor. As a result, an operation for achieving impedance matching can be performed easily.

Moreover, even if the transmission lines are branched at a terminal side and the terminal ends are at a plurality of locations, impedance matching can be achieved reliably even in the branched transmission line, by only connecting one first resistor to the transmission end side of the transmission line for impedance matching.

Furthermore, conventionally, a sensor having a resistor connected to the terminal end of the transmission line and other sensors need to be discriminated and handled. However in the transmission system of the present invention, all the terminal devices such as sensors, which form reception ends, can be handled in the same manner. As a result, discrimination based on a difference of whether or not a resistor is to be inserted, is not required, and hence, workability in manufacturing of the terminal devices and installation thereof at a site can be improved.

BEST MODE FOR CARRYING OUT THE INVENTION

First Embodiment

Figure 1:
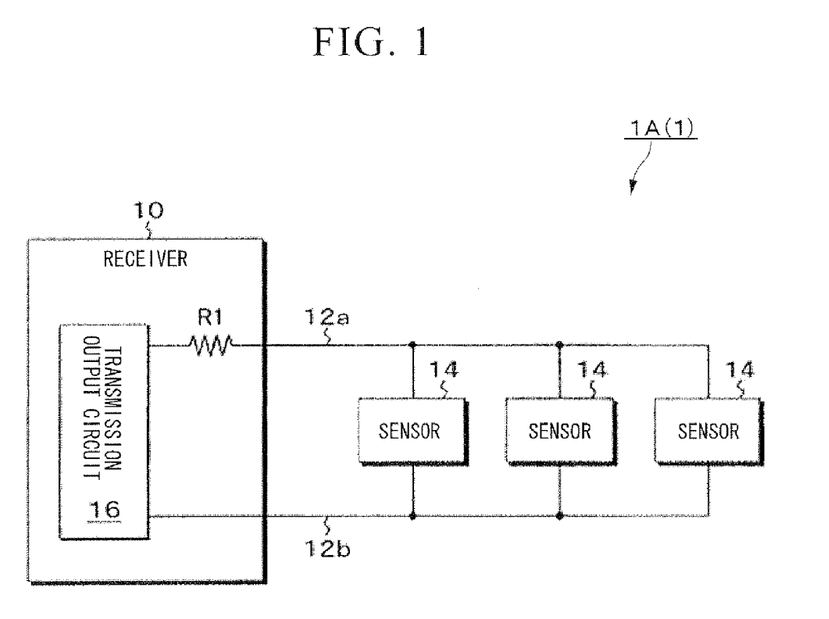
FIG. 1 is a block diagram showing a first embodiment of a transmission system according the present invention, in which a first resistor is connected to one of the transmission lines.

FIG. 1 is a block diagram showing a transmission system 1A (1) according to a first embodiment of the present invention. The transmission system 1A of the first embodiment is schematically constituted by a receiver 10 having a transmission end (transmission output circuit 16), a plurality of reception ends (sensors 14), and a pair of transmission lines 12a and 12b that electrically connect the transmission end to the reception ends. In the present embodiment, a first resistor R1 is connected to the transmission end side of one transmission line 12a.

As shown in FIG. 1, the transmission output circuit 16 that functions as a transmission end is provided in the receiver 10. The pair of transmission lines 12a and 12b are led out from the transmission output circuit 16 toward a terminal side, and a plurality of sensors 14 serving as the reception ends, are connected between these transmission lines 12a and 12b. In FIG. 1, an example in which three sensors 14 are arranged is shown; however, the present invention is not limited to this number.

In the present embodiment, the first resistor R1 for performing impedance matching is connected to the transmission end side of the transmission line 12a of the pair of transmission lines 12a and 12b led out from the transmission output circuit 16 serving as the transmission end. For example, a resistance value r1 of the first resistor R1 is a resistance value equal to a characteristic impedance Z0 of the pair of transmission lines 12a and 12b.

The characteristic impedance Z0 of the pair of transmission lines 12a and 12b used in the present embodiment, that is, an equivalent impedance Z0 as seen from one end side of the transmission lines 12a and 12b is, for example, Z0=100Ω, assuming that these transmission lines 12a and 12b are transmission lines having an unlimited length. In this case, the resistance value r1 of the first resistor R1 connected to an output end side of the transmission output circuit 16 (the transmission end side the transmission line 12a) is r1=100Ω, corresponding to the value of impedance Z0.

Figure 2:
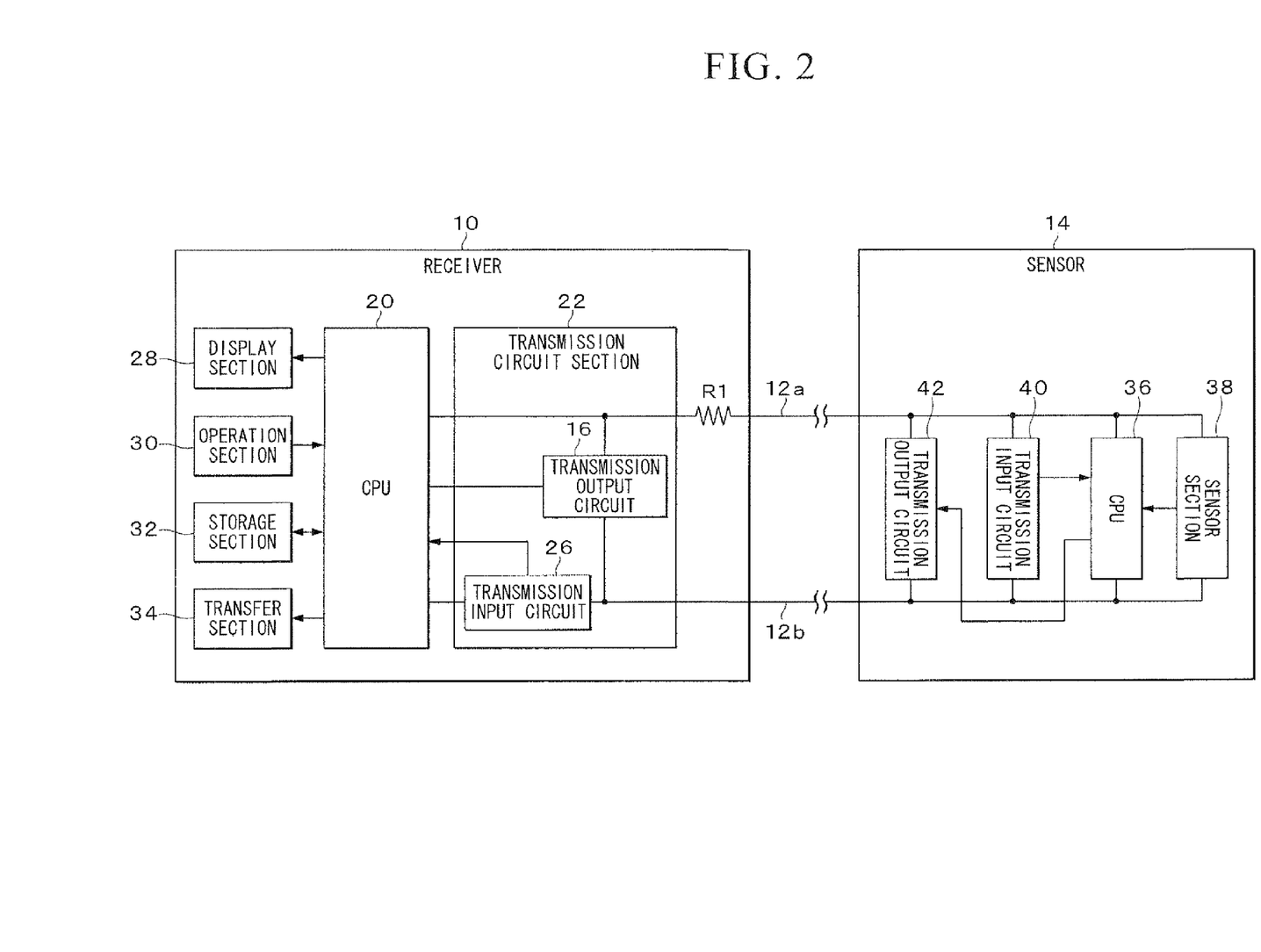
FIG. 2 is a block diagram showing a disaster prevention monitoring system to which the transmission system of the first embodiment is applied.

FIG. 2 is a block diagram showing a disaster prevention monitoring system to which the transmission system of the present embodiment is applied. As shown in FIG. 2, the receiver 10 includes a transmission circuit section 22, a CPU 20, a display section 28, an operation section 30, a storage section 32, and a transfer section 34. The transmission circuit section 22, display section 28, operation section 30, storage section 32, and transfer section 34 are connected to the CPU 20.

The transmission circuit section 22 includes the transmission output circuit 16 and a transmission input circuit 26. The pair of transmission lines 12a and 12b are led out from the transmission circuit section 22, and the plurality of sensors 14 (for example, fire sensors and the like) are connected to these transmission lines 12a and 12b. In FIG. 2, one of the plurality of sensors 14 is representatively shown. The first resistor R1 for performing impedance matching is connected to the one transmission line 12a led out from the transmission circuit section 22.

The transmission output circuit 16 provided in the receiver 10 of the disaster prevention monitoring system in FIG. 2, the transmission line 12a, and the first resistor R1 connected to the transmission end side of the transmission line 12a constitute a circuit on the transmission end side.

The sensor 14 includes a CPU 36, a sensor section 38, a transmission input circuit 40, and a transmission output circuit 42.

In the disaster prevention monitoring system shown in FIG. 2, the transmission circuit section 22 performs digital transmission of a downward telegraphic message and an upward telegraphic message at a data transmission rate of, for example, 19200 bps between the transmission circuit section 22 and the sensor 14. For example, the CPU 20 in the receiver 10 regularly polls the sensor 14 and receives a normal response from the sensor 14. When the normal response cannot be acquired, a fault warning of abnormality in the sensor 14 or the like is output to the transfer section 34 and the display section 28.

The sensor 14 detects an increase in temperature (air temperature) or an increase in smoke density in a sensor section 38 thereof. When detecting an outbreak of fire, the sensor 14 transmits fire detection information to the receiver 10. The receiver 10 side issues a fire warning to the transfer section 34 and the display section 28 in response to the fire detection information.

Digital transmission of the downward telegraphic message from the transmission output circuit 16 of the receiver 10 to the transmission input circuit 40 of the sensor 14 is performed in the voltage mode. The transmission output circuit 16 outputs a voltage pulse to between the pair of transmission lines 12a and 12b by a bit string corresponding to the downward telegraphic message from the CPU 20 of the receiver 10. The voltage pulse output is detected as a change in voltage between the pair of transmission lines 12a and 12b by the transmission input circuit 40 of the sensor 14, and is input to the CPU 36 of the sensor 14. That is, the transmission output circuit 16 outputs a bit string as the downward telegraphic message to be received by the CPU 36 of the sensor 14.

On the other hand, transmission of the upward telegraphic message from the transmission output circuit 42 of the sensor 14 to the transmission input circuit 26 of the receiver 10 is performed in a current mode. The transmission output circuit 42 of the sensor 14 inputs a bit string corresponding to the upward telegraphic message detected by the CPU 36 of the sensor 14 to between the pair of transmission lines 12a and 12b. At this time, when it is bit 1, the transmission output circuit 42 short-circuits between the transmission lines 12a and 12b to a low impedance, passes a line current, and outputs a current pulse. The current pulse is input to the receiver 10 as an upward telegraphic message. The transmission input circuit 26 of the receiver 10 converts the current pulse output from the sensor 14 to a reception voltage at opposite ends of the first resistor R1 to detect the reception voltage, and inputs the reception voltage to the CPU 20 of the receiver 10 as a bit string of the received upward telegraphic message.

In this digital transmission between the receiver 10 and the sensor 14, impedance matching can be performed by connecting the first resistor R1 to the transmission end side of the transmission line 12a led out from the transmission output circuit 16, when a digital signal, that is, a voltage pulse signal is transmitted from the receiver 10 to the sensor 14 in the voltage mode. As a result, at the time of transmission of the voltage pulse from the receiver 10 side to the sensor 14, the occurrence of ringing due to the voltage pulse reflected at the terminal end side of the transmission lines 12a and 12b caused by impedance mismatching between the transmission end side and the transmission terminal end side of the pair of transmission lines 12a and 12b can be suppressed. As a result, digital transmission can be performed normally in the voltage mode.

Figure 3:
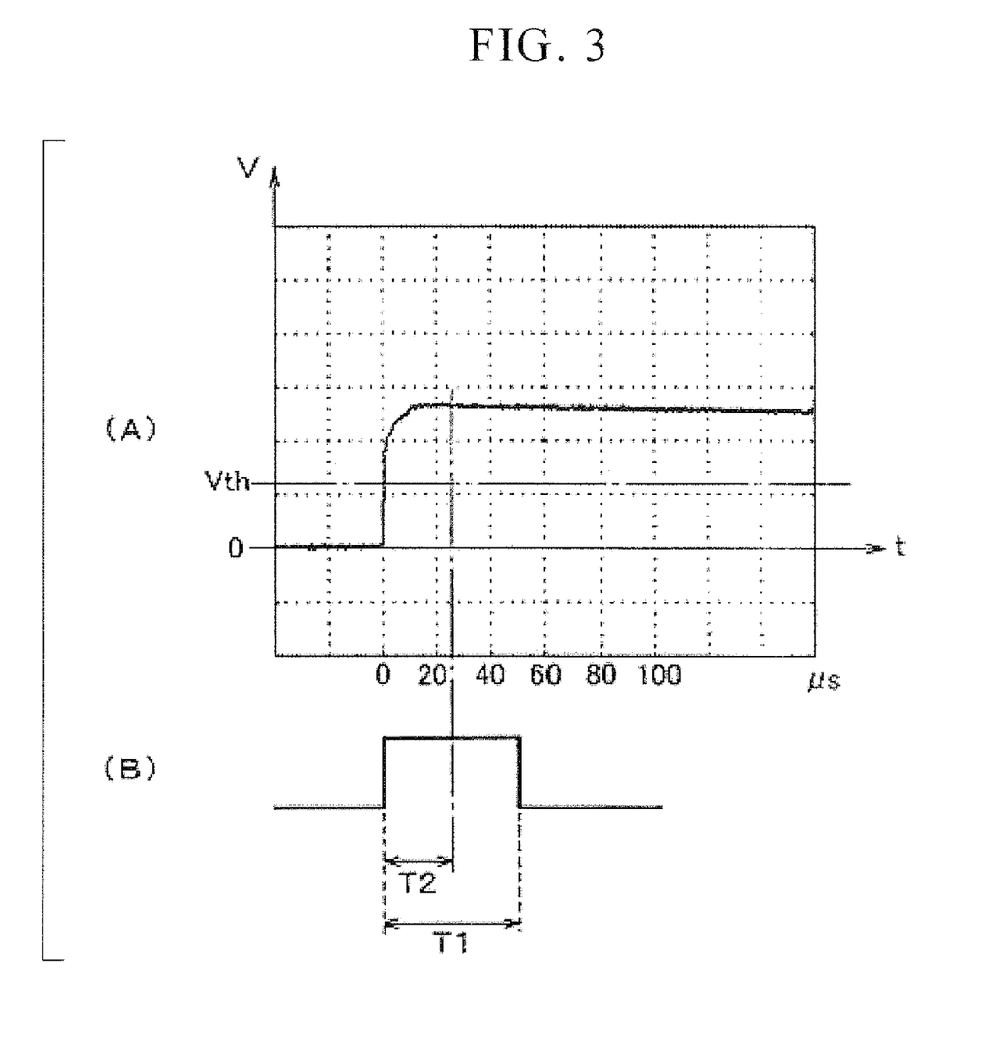
FIG. 3 is a diagram showing a waveform of a voltage pulse at the terminal end side of the transmission lines, when a first resistor having a resistance value equal to a characteristic impedance of the transmission lines is connected to the transmission lines, in the first embodiment.

FIG. 3 shows a waveform of the voltage at the terminal end side of the transmission line 12a with respect to a rise of the voltage pulse, when the resistance value r1 of the first resistor R1 is set to a value equal to the characteristic impedance Z0 of the pair of transmission lines 12a and 12b (for example, $r1=Z0=100\Omega$) in the first embodiment shown in FIG. 1.

Measurement of the waveform of the voltage shown in FIG. 3 was performed, assuming that line lengths L of the pair of transmission lines 12a and 12b in FIG. 1 were respectively L=1 km. The time required for transmitting an electric signal for the line length L=1 km is about 5 microseconds. Therefore, the time required for the voltage pulse sent from the transmission output circuit 16 to be reflected at the terminal end of the transmission line 12a and returned is about 10 microseconds.

FIG. 3 (A) shows a waveform of the voltage at the terminal end side of the transmission line 12a. When the voltage pulse is raised at time t=0, the voltage pulse rises to peak voltage after a predetermined delay time. FIG. 3 (B) shows a voltage pulse transmitted at a transmission rate of 19200 bps. The pulse width T1 of the voltage pulse to be transmitted at 19200 bps is about 52 microseconds, Bit determination under this condition is performed based on whether the voltage exceeds a threshold voltage Vth set to half the peak voltage at a timing of T2=26 microseconds, which is half the pulse width T1.

The waveform of the voltage at the terminal end side of the transmission line 12a shown in FIG. 3 (A) exceeds the threshold voltage Vth when T2=26 microseconds have passed since the rise of the voltage pulse. Therefore, even the sensor 14 arranged at the terminal end side of the pair of transmission lines 12a and 12b can correctly perform bit determination (determination of bit 1).

Figure 4:
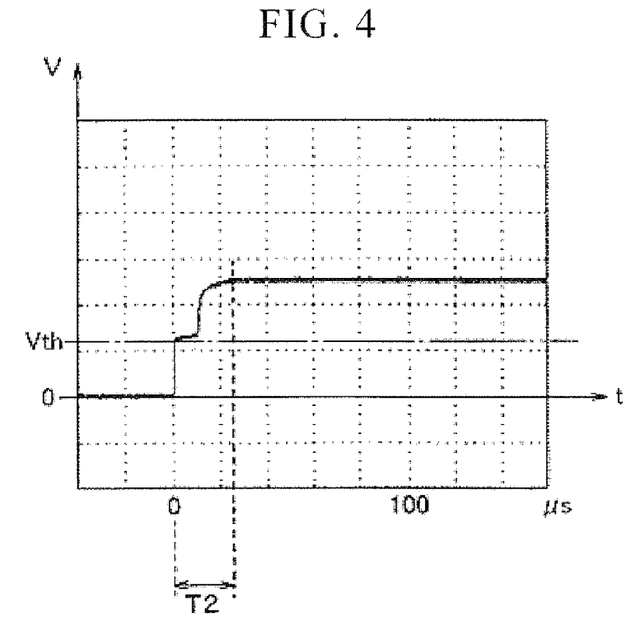
FIG. 4 is a diagram showing a waveform of the voltage pulse at the transmission end side of the transmission lines, when the first resistor having a resistance value equal to the characteristic impedance of the transmission lines is connected to the transmission lines, in the first embodiment.

FIG. 4 shows a waveform of the voltage measured at the transmission output circuit 16 side, that is, at the transmission end side of the transmission line 12a for when $r1=Z0=100\Omega$. In the waveform measured at the transmission end side, when the voltage pulse is raised at time t=0, the voltage pulse first rises to a voltage due to a partial voltage of the first resistor R1 and the characteristic impedance Z0 of the transmission line 12a.

Here because $r1=Z0=100\Omega$, the voltage first rises to a voltage half the peak voltage. Subsequently, when 10 microseconds have passed, which is the time required from the voltage rise for shuttling between on the transmission lines 12a and 12b having a length of L=1 km, a signal component reflected at the terminal ends of these transmission lines 12a and 12b can be acquired. The voltage rises toward the peak voltage due to the signal component.

Here when the voltage at a point in time after T2=26 microseconds required for bit determination of the voltage pulse at 19200 bps have passed from t=0 is seen, the voltage exceeds the threshold voltage Vth and substantially reaches the peak voltage. Accordingly, correct bit determination (determination of bit 1) can be performed even by the sensor 14 arranged at the transmission end side of the receiver 10 in FIG. 1.

When the resistance value r1 of the first resistor R1 inserted for impedance matching is set to a value equal to the value Z0 of the characteristic impedance of the pair of transmission lines 12a and 12b, as shown in FIG. 4, the waveform of the voltage on the output side of the transmission line 12a first rises to half the peak voltage, and then rises to the peak voltage. Therefore, because the first voltage rise value of the sensor 14 connected to a position closest to the receiver 10 is around the threshold voltage Vth, a normal electric signal (voltage pulse) may not be received normally.

Therefore, in order to solve this problem, it is desired that the resistance value r1 of the first resistor R1 is set to 0.2 to 0.8 times the characteristic impedance Z0 of the pair of transmission lines 12a and 12b. That is, r1=0.2Z0 to 0.8Z0.

Here when Z0=100Ω, the resistance value r1 is set to a range of r1=20Ω to 80Ω.

If the resistance value r1 of the first resistor R1 is less than 0.2 times the characteristic impedance Z0 of the pair of transmission lines 12a and 12b, impedance matching cannot be expected. Therefore, 0.2 times the characteristic impedance Z0 is set to a lower limit. Moreover, if the resistance value r1 of the first resistor R1 exceeds 0.8 times the characteristic impedance Z0 of the pair of transmission lines 12a and 12b, it corresponds to a case of r1=Z0, and hence, 0.8 times the characteristic impedance Z0 is set to an upper limit.

Figure 5:
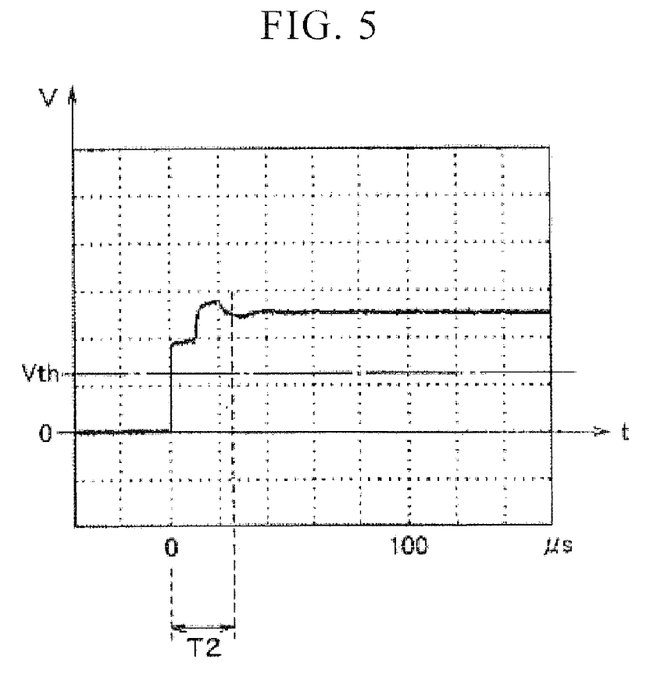
FIG. 5 is a diagram showing a waveform of the voltage pulse at the transmission end side of the transmission lines, when a first resistor having a resistance value of 0.3 times the characteristic impedance of the transmission lines is connected to the transmission lines, in the first embodiment.

FIG. 5 shows a waveform of the voltage at the transmission end side of the transmission line 12a when r1=0.3Z0, for example, r1=0.3×100Ω=30Ω. In this case, the resistance value r1 of the first resistor R1 is substantially ⅓ the characteristic impedance Z0 of the pair of transmission lines 12a and 12b. Therefore, as shown in FIG. 5, when the voltage pulse is raised at time t=0, the voltage at the transmission end side of the transmission line 12a rises up to about 70% of the peak voltage. The voltage value at the rising edge is larger than that of the voltage shown in FIG. 4, and sufficiently exceeds the threshold voltage Vth set to half the peak voltage. Therefore, when r1=0.3Z0, stable reception of the voltage pulse can be ensured even by the sensor 14 connected to the position closest to the receiver 10.

Actually, bit determination is performed at a timing after T2=26 microseconds have passed since time t0. Because the voltage value at this time is near the peak voltage as shown in FIG. 5, bit determination (determination of bit 1) can be reliably performed.

Moreover in the present embodiment, the resistance value r1 of the first resistor R1 can be set to a larger value than the characteristic impedance Z0 of the pair of transmission lines 12a and 12b. In this case, it is desired that the resistance value r1 of the first resistor R1 is set to 1.5 times to 4 times the characteristic impedance Z0 of the pair of transmission lines 12a and 12b. That is, r1=1.5Z0 to 4Z0.

Here when Z0=100Ω, the resistance value r1 is set to a range of r1=150Ω to 400Ω.

When the resistance value r1 of the first resistor R1 is less than 1.5 times the characteristic impedance Z0 of the pair of transmission lines 12a and 12b, because it corresponds to a case of r1=Z, then 1.5 times the characteristic impedance Z0 is set to the lower limit. Moreover when the resistance value r1 of the first resistor R1 exceeds 4 times the characteristic impedance Z0 of the pair of transmission lines 12a and 12b, because the rise of the voltage pulse to the peak voltage is too late, then 4 times the characteristic impedance Z0 is set to the upper limit.

Figure 6:
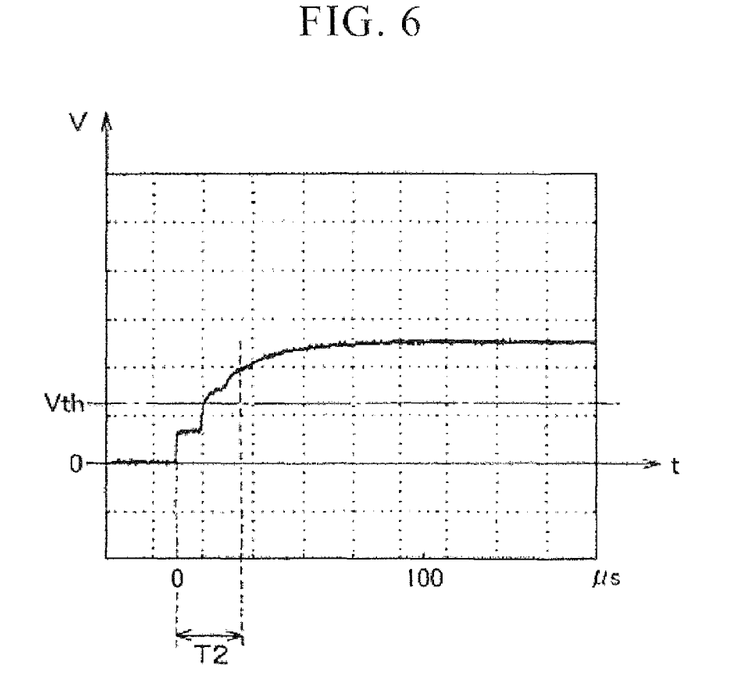
FIG. 6 is an explanatory diagram showing a waveform at the transmission end side of the transmission lines, when a first resistor having a resistance value of 3 times the characteristic impedance of the transmission lines is connected to the transmission lines, in the first embodiment.

FIG. 6 shows a waveform of the voltage at the transmission end side of the transmission line 12a in the case of r1=3Z0=300Ω, as the resistance value r1 of the first resistor R1. Thus, when the resistance value r1 of the first resistor R1 is 3 times the characteristic impedance Z0 of the pair of transmission lines 12a and 12b, the voltage at the transmission end side of the transmission line 12a first rises up to about 25% of the peak voltage with respect to the rise of the voltage pulse at time t=0. Thereafter, the voltage increases stepwise upon reception of a component reflected at the terminal end of the transmission line 12a.

Also in this case, bit determination is performed based on the voltage value at a point in time after T2=26 microseconds have passed since the rise of the voltage pulse at time t=0. Because the voltage at this time sufficiently exceeds the threshold voltage Vth, correct bit determination (determination of bit 1) can be performed even by the sensor 14 arranged at the position closest to the receiver 10.

Figure 7:
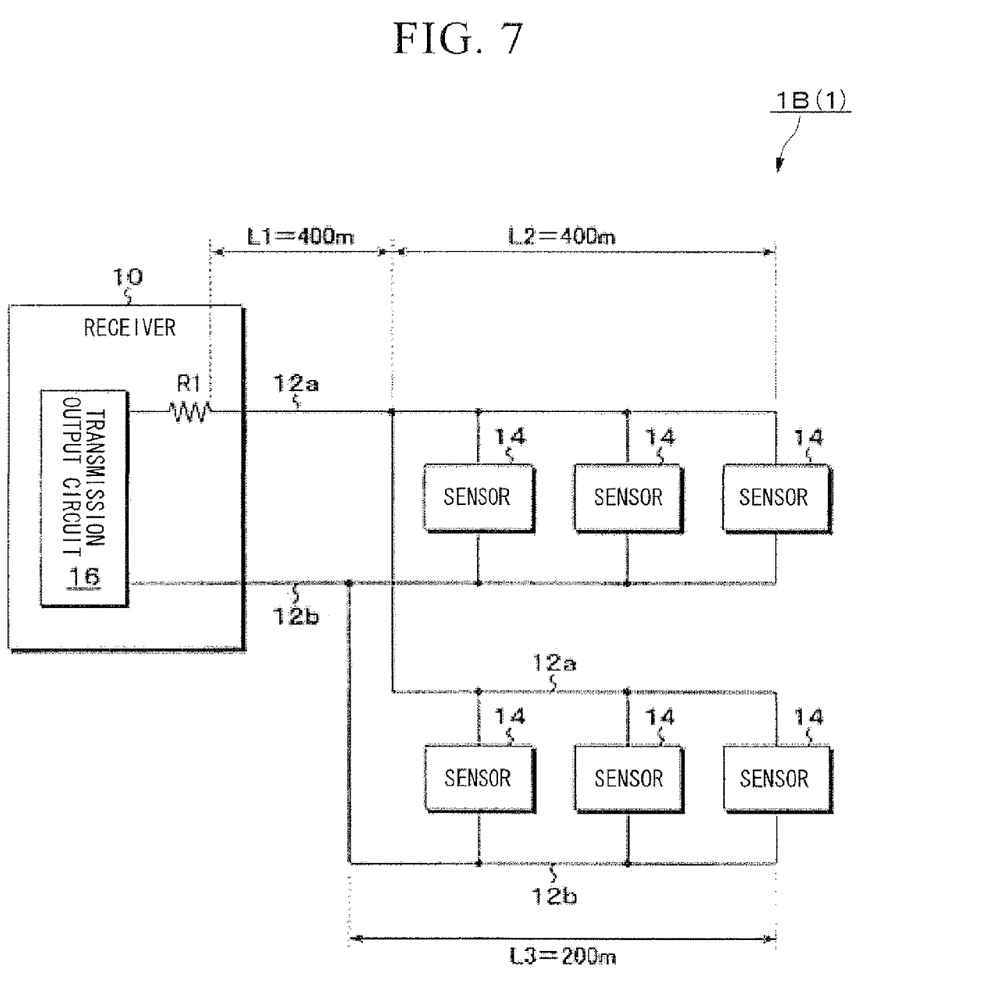
FIG. 7 is a block diagram showing a transmission system according to a second embodiment of the present invention, in which the transmission lines are branched.

FIG. 7 is a block diagram showing a transmission system 1B (1) according to a second embodiment of the present invention, in which the transmission lines are branched. In FIG. 7, a pair of transmission lines 12a and 12b are led out from a transmission output circuit 16 provided in a receiver 10. These transmission lines 12a and 12b are branched to two systems, and a plurality of sensors 14 are connected to the respective systems.

Even in this case in which the pair of transmission lines 12a and 12b are branched, a first resistor R1 for impedance matching is connected to a transmission end side of one transmission line 12a led out from the transmission output circuit 16. As a resistance value of the first resistor R1, any value of:

r1=Z0;
r1=0.2Z0 to 0.8Z0; and
r1=1.5Z0 to 4Z0 can be taken, as in the embodiment described above.

Figure 8:
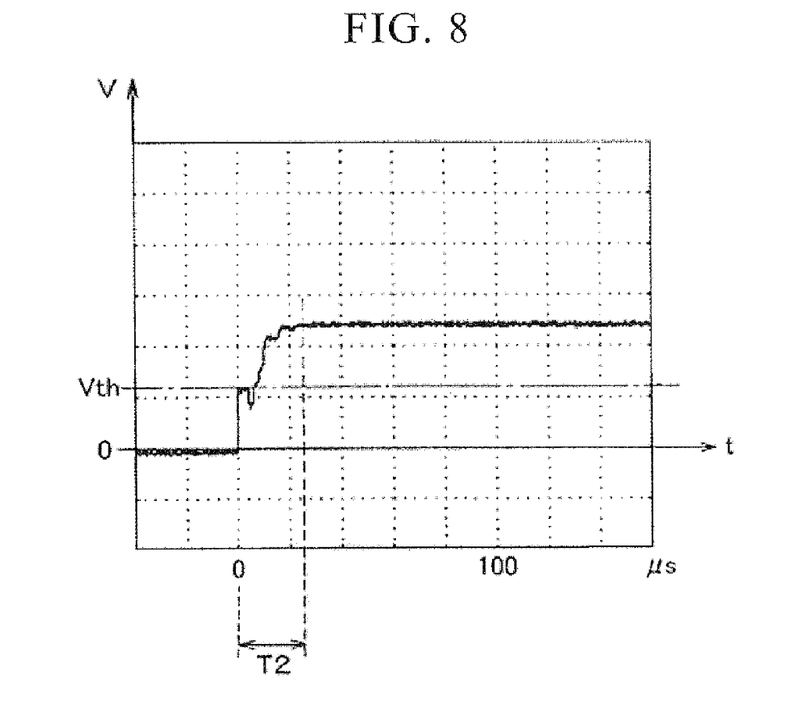
FIG. 8 is a diagram showing a waveform of the voltage pulse at the transmission end side of the transmission lines in the second embodiment.

FIG. 8 shows the waveform of the voltage at the transmission end side of the transmission line 12a when r1=Z0=100Ω in the embodiment shown in FIG. 7. Measurement was performed, assuming that a line length from the receiver 10 to a branch point in FIG. 7 was L1=400 m, and line lengths of the transmission lines 12a and 12b from the branch point are L2=400 m and L3=200 m, respectively.

Also in the present embodiment, as in the first embodiment, bit determination of a reception pulse by the sensors 14 in the respective systems provided at positions closest to the receiver 10 is performed at a timing after T2=26 microseconds have passed from the rise of a voltage pulse at time t=0. In this case, as shown in FIG. 8, because the voltage at T2 sufficiently exceeds a threshold voltage Vth and is near a peak voltage, bit determination (determination of bit 1) can be correctly performed.

Figure 9:
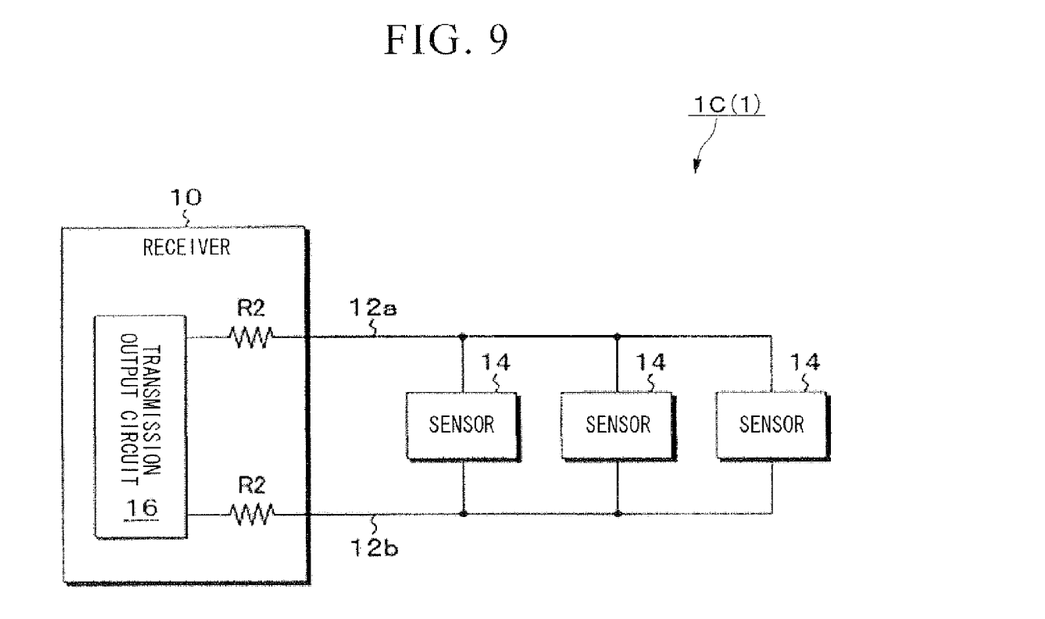
FIG. 9 is a block diagram showing a transmission system according to a third embodiment of the present invention, in which resistors are connected to both of the transmission lines.

FIG. 9 is a block diagram of a transmission system 1C (1) according to a third embodiment of the present invention. In the present embodiment, a second resistor R2 is respectively connected at both transmission end sides of a pair of transmission lines 12a and 12b led out from a receiver 10. These second resistors R2 respectively have a resistance value r2 half the resistance value r1 of the first resistor R1 connected to one transmission line 12a in the first embodiment. The resistance value r2 of the second resistors R2 in the present embodiment can take values described below, corresponding to three types of resistance values r1 of the first resistor R1 in the first embodiment.

(1) $r2=r1/2=Z0/2$
(2) $r2=r1/2=(0.2Z0)/2$ to $(0.8Z0)/2$
(3) $r2=r1/2=(1.5Z0)/2$ to $(4Z0)/2$

As shown in FIG. 1 to FIG. 7, when the first resistor R1 is connected to one transmission line 12a, the pair of transmission lines 12a and 12b become unbalanced transmission lines. On the other hand, in the present embodiment, because the second resistor R2 is respectively connected to both of the pair of transmission lines 12a and 12b, balanced transmission lines are formed. As a result, noise components in these transmission lines 12a and 12b are balanced out, thereby enabling to realize noise-resistant digital transmission.

Figure 10A:
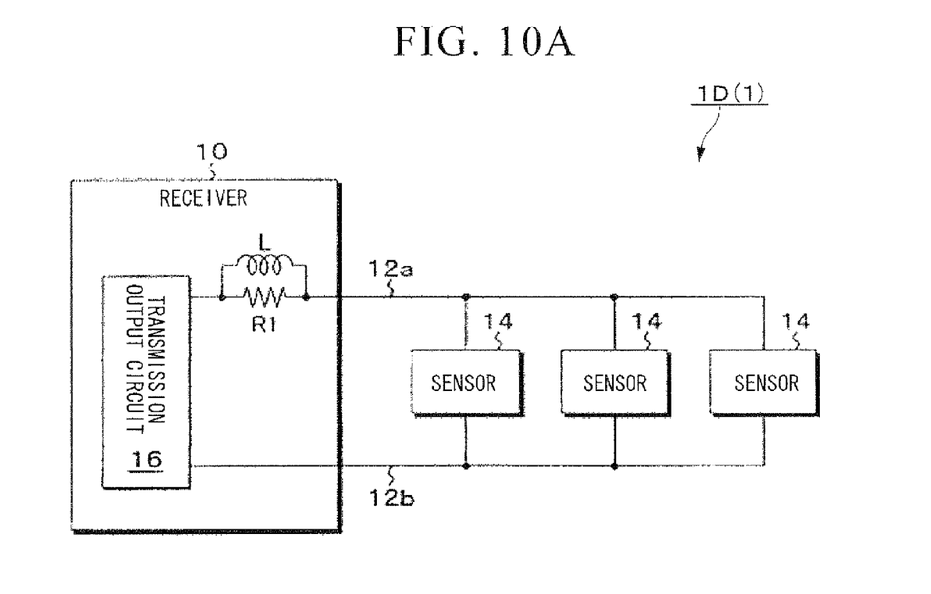
FIG. 10A is a block diagram showing a transmission system according to a fourth embodiment of the present invention, in which an inductance is connected in parallel with a resistor connected to one of the transmission lines.

FIG. 10A is a block diagram of a transmission system 1D (1) according to a fourth embodiment of the present invention. In the transmission system 1D of the present embodiment, an inductance L (coil) is connected in parallel with a first resistor R1 connected to a transmission end side of one transmission line 12a for impedance matching. Direct-current power is bypassed to a terminal (sensor 14) side by the inductance L.

As the inductance L, for example, an inductance of 30 μH to 20 mH can be used. Because the inductance L is connected in this way in parallel with the first resistor R1, a situation where the power-supply voltage supplied to the sensor 14 side decreases due to the insertion of the first resistor R1 can be prevented.

Figure 10B:
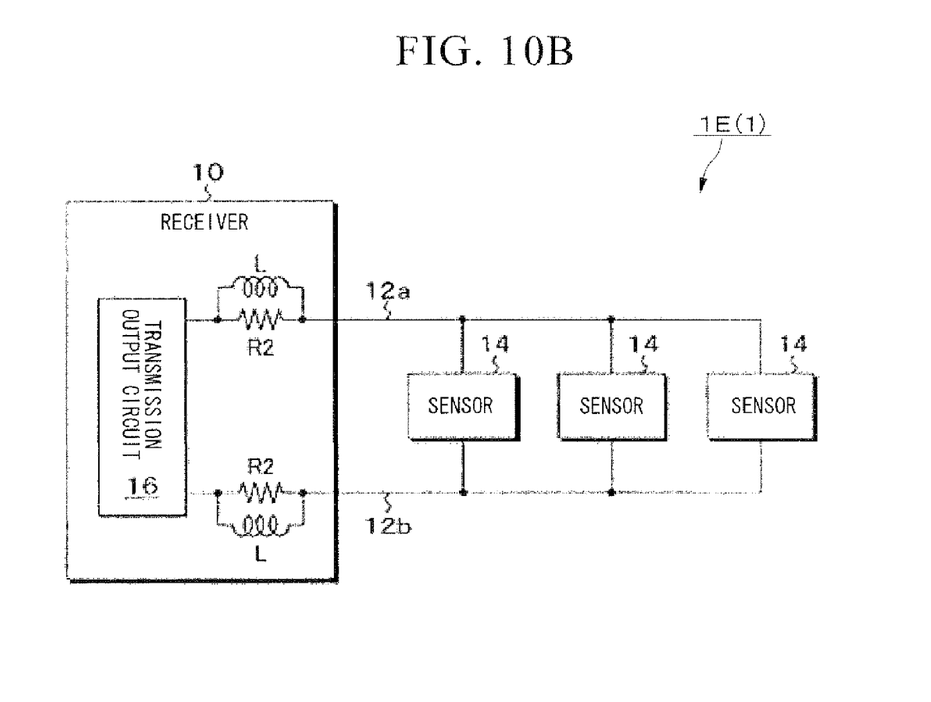
FIG. 10B is a block diagram showing a transmission system according to a fifth embodiment of the present invention, in which an inductance is respectively connected in parallel with resistors connected to both of the transmission lines.

FIG. 10B is a block diagram of a transmission system 1E (1) according to a fifth embodiment of the present invention. In the present embodiment, in the transmission system 1C of the third embodiment shown in FIG. 9, an inductance L is respectively connected in parallel with the second resistor R2 respectively connected to both transmission end sides of the pair of transmission lines 12a and 12b. In the present embodiment also, as in the transmission system 1D of the fourth embodiment, a situation where the power-supply voltage supplied to the sensor 14 side decreases due to the insertion of the second resistor R2 can be prevented.

A waveform of the current at the terminal end side of the transmission line 12a in the embodiments shown in FIG. 10A and FIG. 10B becomes as shown in FIG. 3 (A). In this case, supply of power is performed by using direct current. Direct-current resistance of the inductance L is set to a sufficiently small value. Accordingly, a loss of supply power for impedance matching is minimal.

In this manner, in the fourth and fifth embodiments, the inductance L is respectively connected in parallel with the first resistor R1 connected to the transmission end side of one transmission line 12a or the first and second resistors R2 connected to the transmission end side of both of the transmission lines 12a and 12b for impedance matching, so that the direct-current power is bypassed to the sensor 14 side. As a result, an embodiment preferable to the disaster prevention monitoring system such as fire monitoring that performs transmission of digital data at the same time as supplying power to the sensor 14 from the receiver 10 via these transmission lines 12a and 12b can be obtained.

In the above-described embodiments, transfer of the digital data in the disaster prevention monitoring system that monitors for fire, gas leakage, and the like is taken as an example. However, the present invention is not limited thereto, and the present invention can be directly applied to an appropriate transmission system with a transmission end and a reception end having a configuration in which transmission lines are branched to a terminal side.

Preferred embodiments of the present invention are explained above, however, the present invention is not limited to these embodiments, and addition, omission, replacement, and other changes of the configuration can be made without departing from the scope of the present invention. The present invention is not limited by the above-described explanation, and is limited only by the scope of the appended claims.

INDUSTRIAL APPLICABILITY

According to the transmission system of the present invention, a first resistor needs only to be connected to a transmission line on a transmission end side such as a receiver for impedance matching. Therefore, it is not necessary to check a sensor connected to a terminal end of a transmission line to insert the resistor in the sensor. Accordingly, an operation for achieving impedance matching is facilitated.

Moreover, even if the transmission lines are branched to the terminal side and the terminal ends are at a plurality of locations, impedance matching can be reliably achieved even with the branched transmission lines, only by connecting one first resistor to the transmission end side of the transmission line for impedance matching.

BRIEF DESCRIPTION OF THE REFERENCE SYMBOLS 1 (1A, 1B, 1C, 1D, and 1E): Transmission system
10: Receiver
12a, 12b: Transmission line
14: Sensor
16: Transmission output circuit
20, 36: CPU
22, 42: Transmission circuit section
26, 40: Transmission input circuit
28: Display section
30: Operation section
32: Storage section
34: Transfer section
38: Sensor section
R1: First resistor
R2: Second resistor
L: Inductance

The invention claimed is:
1. A transmission system comprising:
a receiver;
a plurality of sensors; and
a pair of transmission lines that electrically connect the receiver to the plurality of sensors,
wherein the receiver regularly polls the plurality of sensors by outputting a voltage pulse to between the pair of transmission lines as a bit string corresponding to a downward telegraphic message,
each of the plurality of sensors transmits a response to the receiver by outputting a current pulse to between the pair of transmission lines as a bit string corresponding to an upward telegraphic message,
the receiver includes a transmission circuit section that outputs the voltage pulse and receives the current pulse, and a first resistor having a predetermined resistance value depending on a characteristic impedance of the pair of transmission lines,
the first resistor is connected in series between the transmission circuit section and only one of the pair of transmission lines, and each of the plurality of sensors does not include a resistor having a predetermined resistance value depending on a characteristic impedance of the pair of transmission lines.

2. The transmission system according to claim 1, wherein an inductance that bypasses direct-current power is further connected in parallel with the first resistor by the pair of transmission lines.

3. The transmission system according to claim 1, wherein the first resistor has a resistance value equal to the characteristic impedance of the pair of transmission lines.

4. The transmission system according to claim 1, wherein the first resistor has a resistance value of from 0.2 times to 0.8 times or from 1.5 times to 5.0 times of the characteristic impedance of the pair of transmission lines.

5. A transmission system comprising:
a receiver;
a plurality of sensors; and
a pair of transmission lines that electrically connect the receiver to the plurality of sensors,
   wherein the receiver regularly polls the plurality of sensors by outputting a voltage pulse to between the pair of transmission lines as a bit string corresponding to a downward telegraphic message,
   each of the plurality of sensors transmits a response to the receiver by outputting a current pulse to between the pair of transmission lines as a bit string corresponding to an upward telegraphic message,
   the receiver includes: a transmission circuit section that outputs the voltage pulse and receives the current pulse; two second resistors having a predetermined resistance value depending on a characteristic impedance of the pair of transmission lines; and two inductances that bypass direct-current power,
   one of the two second resistors is connected in series between the transmission circuit section and one of the pair of transmission lines,
   the other of the two second resistors is connected in series between the transmission circuit section and the other of the pair of transmission lines,
   one of the two inductances is connected in parallel with the one of the two second resistors,
   the other of the two inductances is connected in parallel with the other of the two second resistors, and
   each of the plurality of sensors does not include a resistor having a predetermined resistance value depending on a characteristic impedance of the pair of transmission lines.

6. The transmission system according to claim 5, wherein each of the two second resistors has a resistance value of half the characteristic impedance of the pair of transmission lines.

7. The transmission system according to claim 5, wherein each of the two second resistors has a resistance value of half the resistance value of from 0.2 times to 0.8 times or from 1.5 times to 5.0 times of the characteristic impedance of the pair of transmission lines.

\* \* \* \* \*